United States Patent
Hoshikawa

(10) Patent No.: US 10,568,244 B2
(45) Date of Patent: Feb. 18, 2020

(54) FOREIGN MATTER REMOVAL METHOD AND FOREIGN MATTER REMOVAL DEVICE

(71) Applicant: FUJI CORPORATION, Chiryu-shi (JP)

(72) Inventor: Kazumi Hoshikawa, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 253 days.

(21) Appl. No.: 15/576,752

(22) PCT Filed: May 27, 2015

(86) PCT No.: PCT/JP2015/065210
§ 371 (c)(1),
(2) Date: Nov. 24, 2017

(87) PCT Pub. No.: WO2016/189682
PCT Pub. Date: Dec. 1, 2016

(65) Prior Publication Data
US 2018/0168079 A1     Jun. 14, 2018

(51) Int. Cl.
*H05K 13/04* (2006.01)
*H05K 3/30* (2006.01)

(52) U.S. Cl.
CPC ............ *H05K 13/04* (2013.01); *H05K 3/303* (2013.01); *H01L 2924/14* (2013.01)

(58) Field of Classification Search
CPC .... G01N 1/08; G01N 1/10; G01N 2001/1006; H01L 21/67; H01L 2924/14; H05K 3/303; H05K 13/04
See application file for complete search history.

(56) References Cited

U.S. PATENT DOCUMENTS

| 5,211,062 A | * | 5/1993 | Moser | ...................... G01N 1/08 73/863.83 |
| 5,507,874 A | * | 4/1996 | Su | ......................... B08B 7/0035 134/1 |

(Continued)

FOREIGN PATENT DOCUMENTS

| EP | 2 838 332 A1 | 2/2015 |
| EP | 2 916 637 A1 | 9/2015 |

(Continued)

OTHER PUBLICATIONS

Extended European Search Report dated Apr. 3, 2018 in Patent Application No. 15893316.8, 7 pages.

(Continued)

*Primary Examiner* — Carl J Arbes
(74) *Attorney, Agent, or Firm* — Oblon, McClelland, Maier & Neustadt, L.L.P.

(57) ABSTRACT

A nozzle drying device is provided, in which a suction nozzle held by a holding chuck is inserted inside a housing, and air is blown towards the suction nozzle by operation of air blow device. A suction pipe of the suction nozzle held by the holding chuck is inserted inside a body tube by the suction pipe being contacted against contacting table. By sliding the suction pipe and the body tube with respect to each other by inserting the suction pipe inside the body tube, liquid is ejected from inside the body tube, and the liquid can be removed by blowing air. Thus, it is possible to appropriately remove liquid that has entered between the suction pipe and the body tube.

6 Claims, 9 Drawing Sheets

(56) References Cited

U.S. PATENT DOCUMENTS

| | | | | |
|---|---|---|---|---|
| 5,607,515 | A * | 3/1997 | Takahashi | C23C 16/4405 134/18 |
| 5,942,699 | A * | 8/1999 | Ornath | G01N 1/2226 73/863.12 |
| 6,327,021 | B1 * | 12/2001 | Higashiguchi | G03F 1/82 355/30 |
| 6,408,701 | B1 * | 6/2002 | Fujita | G01N 1/2226 73/864.33 |
| 6,755,934 | B2 * | 6/2004 | Matsuoka | C23C 16/4407 134/18 |
| 7,526,948 | B2 * | 5/2009 | Yamamoto | G01N 1/24 73/104 |
| 8,316,867 | B2 * | 11/2012 | Jennings | B08B 7/00 134/137 |
| 2002/0153024 | A1 * | 10/2002 | Akiba | B08B 7/00 134/1.1 |

FOREIGN PATENT DOCUMENTS

| | | |
|---|---|---|
| JP | 2011-003679 A | 1/2011 |
| JP | 2011-078881 A | 4/2011 |
| WO | 2013/153598 A1 | 10/2013 |
| WO | WO 2014/069016 A1 | 5/2014 |

OTHER PUBLICATIONS

International Search Report dated Aug. 25, 2015, in PCT/JP2015/065210 filed May 27, 2015.

* cited by examiner

FOREIGN MATTER REMOVAL METHOD AND FOREIGN MATTER REMOVAL DEVICE

TECHNICAL FIELD

The present disclosure relates to a foreign matter removal method and a foreign matter removal device for removing foreign matter adhering to a component holding body that is used for holding a component.

BACKGROUND ART

For a component holding body such as a suction nozzle or a mechanical chuck, to maintain appropriate holding of a component, removal of foreign matter adhering to the component holding body is performed. Examples of technology for removing foreign matter adhering to a component holding body are disclosed in the patent literature below.
Patent literature 1: JP-A-2011-3679
Patent literature 2: JP-A-2011-78881

SUMMARY

According to technology disclosed in the above patent literature, it is possible to a certain extent to remove foreign matter from a component holding body. However, with a component holding body, because a holding section for holding a component and a main body section for holding the holding section are relatively movable, it is difficult to remove foreign matter from between the holding section and the main body section. The present disclosure takes account of such circumstances, and an object thereof is to appropriately remove foreign matter from between a holding section and a main body section.

To solve the above problem, the present disclosure is directed to a foreign matter removal method for removing foreign matter adhering to a component holding tool including a holding section for holding a component and a main body section for holding the holding section, the holding section and the main body section being relatively movable, the foreign matter removal method including: a first gas blowing process for blowing a gas towards a component holding body held by a holding tool; and a moving process for relatively moving the holding section and the main body section.

Also, for solving the above problems, the present disclosure is directed to a foreign matter removal device for removing foreign matter adhering to a suction nozzle including a suction pipe for picking up and holding a component via air suction, and a holding tube for holding the suction pipe inside the holding tube in a state with a leading end of the suction pipe protruding from the holding tube, the suction pipe and the holding tube being relatively movable, the foreign matter removal device including: a tubular housing; a first gas blow device configured to blow gas towards the inside of the suction pipe of the suction nozzle held by a holding tool; a second gas blow device configured to blow gas towards the inside of the housing; and a contacting section attached to the housing and configured to contact the suction pipe of the suction nozzle, wherein the suction pipe is moved towards the outside of the holding tube by the first gas blow device blowing gas inside the suction pipe, the suction pipe is moved towards the inside of the holding tube by contacting the suction pipe of the suction nozzle held by the holding tool against the contacting section, and foreign matter adhering to the suction nozzle is removed by the second gas blow device blowing gas towards the inside of the housing in a state with the suction nozzle held by the holding tool moved inside of the housing.

With the disclosed foreign matter removal method, gas is blown towards a component holding body held by a holding tool. Also, when gas is blown towards the component holding body, the holding section and the main body section are moved relatively. That is, it is possible to remove foreign matter by blowing a gas while relatively moving the holding section and the main body section. By this, it is possible to appropriately remove foreign matter from between the holding section and the main body section.

Also, with the disclosed foreign matter removal device, gas is blown towards a suction nozzle held by a holding tool. And, when gas is blown towards the suction nozzle, the suction pipe and the holding tube are moved relatively by the suction pipe being contacted against a contacting section and gas being blown by the first gas blow device. That is, the suction pipe is advanced and retracted inside the holding tube. By this, it is possible to remove foreign matter by blowing a gas while advancing and retracting the suction pipe in the holding tube. By this, it is possible to appropriately remove foreign matter from between the suction pipe and the holding tube.

DESCRIPTION OF PREFERRED EMBODIMENTS

Figure 1:
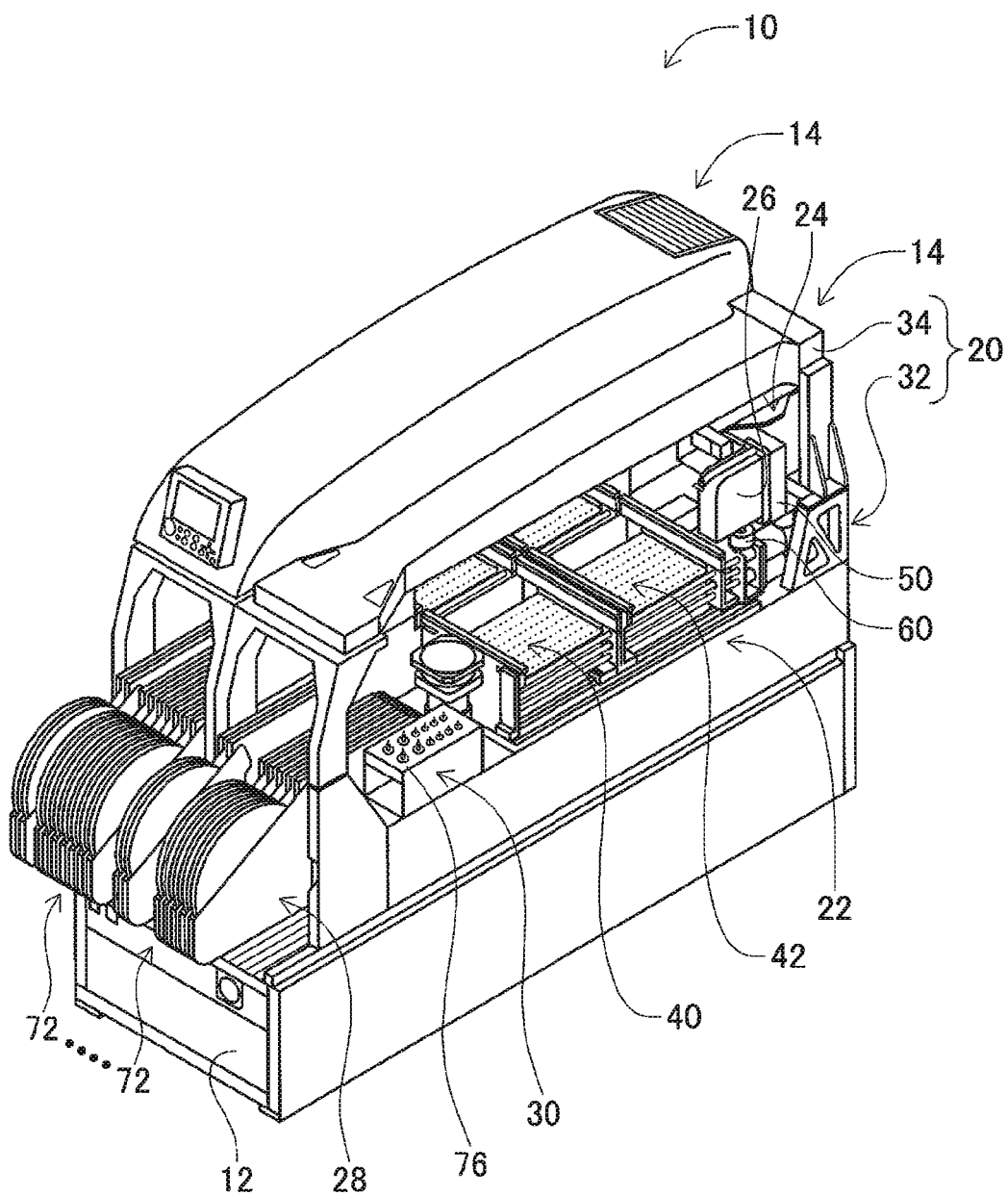
FIG. 1 is a perspective view of an electronic component mounter.

The following describes in detail referring to the figures example embodiments of the present disclosure.
Configuration of Electronic Component Mounting Device
FIG. 1 shows electronic component mounting device 10. Mounting device 10 includes one system base 12, and two electronic component mounters (hereinafter in some cases abbreviated to "mounter") 14 provided adjacently to each other on system base 12. Note that, the direction in which the mounters 14 are lined up is referred to as the X-axis direction, and the horizontal direction which is perpendicular to the X-axis direction is referred to as the Y-axis direction.

Each mounter 14 is provided mainly with mounter body 20, conveyance device 22, mounting head moving device (hereinafter in some cases abbreviated to "moving device") 24, mounting head 26, supply device 28, and nozzle station 30. Mounter body 20 is configured from frame 32 and beam 34 that is mounted on the frame 32.

Conveyance device 22 is provided with two conveyor devices 40 and 42. The two conveyor devices 40 and 42 are parallel to each other and are provided on frame 32 extending in the X-axis direction. Each of the two conveyor devices 40 and 42 conveys a circuit board held on the respective conveyor devices 40 and 42 in the X-axis direction using an electromagnetic motor (not shown). Also, the circuit board is held at a predetermined position by a board holding device (not shown).

Moving device 24 is an XY robot type moving device. Moving device 24 is provided with an electromagnetic motor (not shown) that slides a slider 50 in the X-axis direction, and an electromagnetic motor (not shown) that slides slider 50 in the Y-axis direction. Mounting head 26 is attached to slider 50, and the mounting head 26 is moved to any position on frame 32 by the operation of the two electromagnetic motors.

Figure 2:
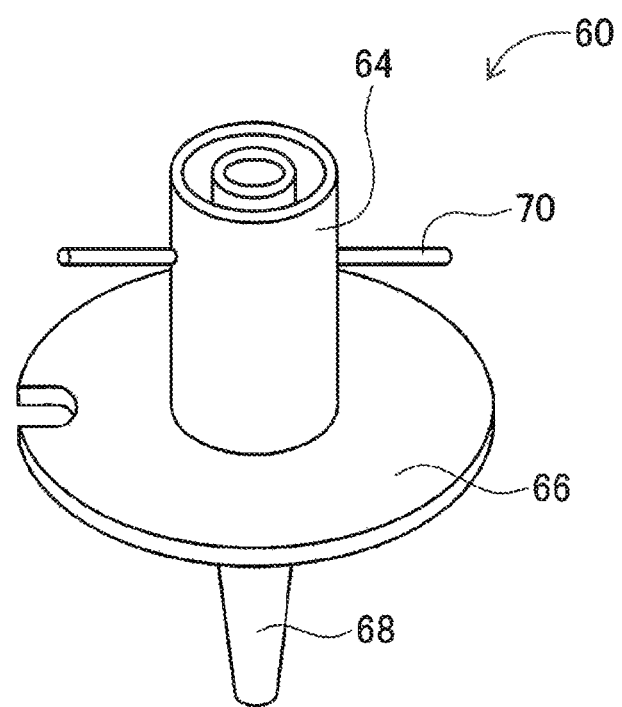
FIG. 2 is perspective view of a suction nozzle.

Mounting head 26 mounts electronic components on a circuit board. Suction nozzle 60 is provided on the lower end of mounting head 26. As shown in FIG. 2, suction nozzle 60 is configured from body tube 64, flange 66, suction tube 68, and locking pin 70. Body tube 64 is cylindrical and flange 66 is fixed to the outer surface of body tube 64 so as to project outwards. Suction tube 68 is a thin pipe that is held on body tube 64 movable in an axis line direction in a state extending downwards from the lower end of body tube 64. Locking pin 70 is provided on an upper section of body tube 64 such that locking pin 70 extends in the diameter direction of body tube 64. Suction nozzle 60 is attached to mounting head 26 using locking pin 70 such that suction nozzle 60 is attachable/detachable with one touch. Also, a spring (not shown) is built into mounting head 26, and the spring applies elastic force to suction pipe 68 of suction nozzle 60 attached to mounting head 26. By this, suction tube 68 is biased so as extend down from the lower end of body tube 64 by the elastic force of the spring built into mounting head 26.

Further, suction nozzle 60 is connected to a positive/negative pressure supply device (not shown) via a negative pressure air and positive pressure air passage. Each suction nozzle 60 picks up and holds an electronic component using negative pressure, and releases the held electronic component using positive pressure. Also, mounting head 26 has a nozzle raising/lowering device (not shown) that raises/lowers suction nozzle 60. Mounting head 26 changes the position of the held electronic component in a vertical direction by the nozzle raising/lowering device.

As shown in FIG. 1, supply device 28 is a feeder type supply device that has multiple tape feeders 72. Tape feeders 72 house taped components in a wound state. Taped components are electronic components that have been put into tape. Tape feeders 72 deliver the taped components using a feeding device (not shown). Accordingly, feeder type supply device 28 supplies an electronic component to a supply position through the feeding delivery of the taped components.

Nozzle station 30 includes nozzle tray 67. Multiple suction nozzles 60 are housed in nozzle tray 76. In the nozzle station 30, exchanging of a suction nozzle 60 attached to mounting head 26 with a suction nozzle 60 housed in nozzle tray 76, and the like is performed as necessary. Nozzle tray 76 is capable of being attached and detached in relation to nozzle station 30, such that the collection of suction nozzles 60 housed in nozzle tray 76, replenishment of suction nozzles 60 to nozzle tray 76, and the like can be performed outside of mounter 14.

Mounting Work by a Mounter

It is possible to perform mounting work with respect to a circuit board held in conveyance device 22 using mounting head 26 in mounter 14 with the above configuration. Specifically, based on commands of a control device (not shown) of mounter 14, a circuit board is conveyed to a work position, and the circuit board is held at that position by a board holding device. Also, based on commands of the control device, tape feeder 72 feeds taped components and supplies an electronic component to a supply position. Then, mounting head 26 moves above the supply position of the electronic component and picks up and holds the electronic component using suction nozzle 60. Continuing, mounting head 26 moves above the circuit board and mounts the held electronic component on the circuit board.

In mounter 14, as given above, an electronic component supplied by tape feeder 72 is picked up and held by suction nozzle 60 and then mounted on the circuit board. Thus, if a problem occurs with suction nozzle 60, mounting work may not be able to be performed properly, and appropriate management of suction nozzle 60 is required. Thus, management of suction nozzle 60 is performed by the nozzle management device as described below.

Configuration of Nozzle Management Device

Figure 3:
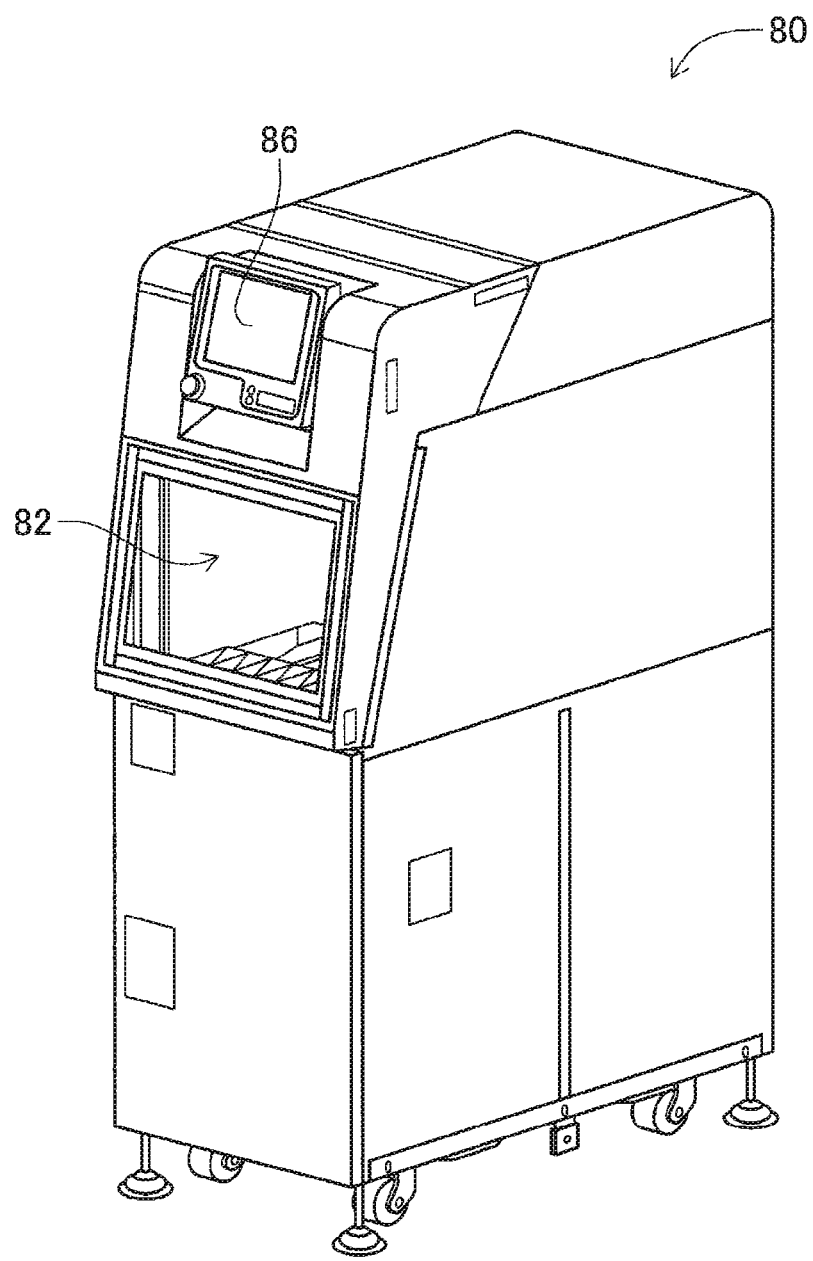
FIG. 3 is a perspective view showing the outside of a nozzle management device.

As shown in FIG. 3, nozzle management device 80 is largely a rectangular cuboid with door 82 provided on the front for storing a nozzle tray 76 inside nozzle management device 80 and for removing a nozzle tray 76 from nozzle management device 80. Operation panel 86 for displaying various information is provided above door 82.

Figure 4:
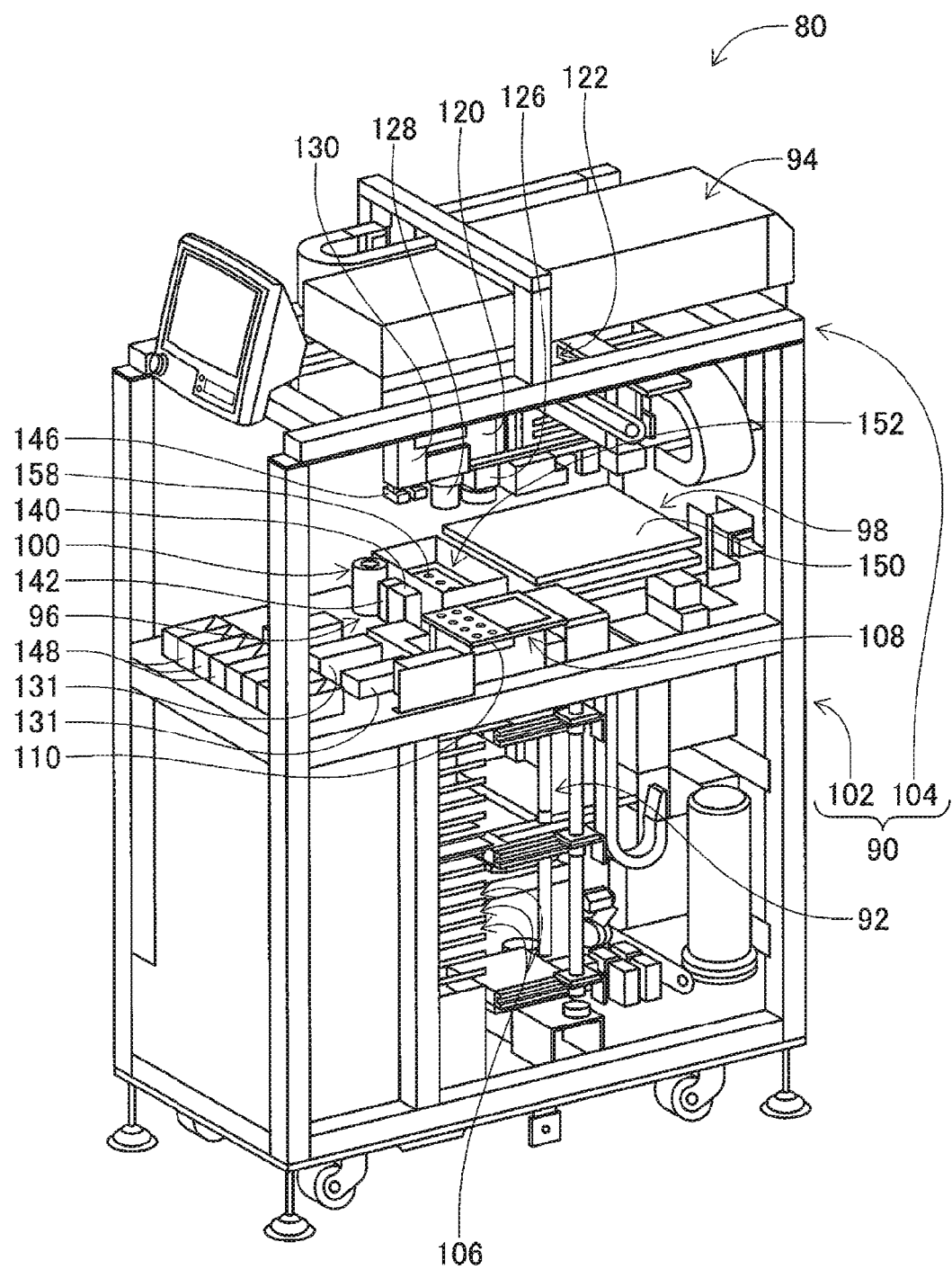
FIG. 4 is a perspective view showing the internal structure of the nozzle management device.

As shown in FIG. 4, nozzle management device 80 includes management device main body 90, pallet housing device 92, nozzle transfer device 94, nozzle inspection device 96, nozzle cleaning device 98, and nozzle drying device 100. Note that, FIG. 4 is a perspective view showing nozzle management device 80 with outer covers removed to illustrate the internal configuration of nozzle management device 80.

(a) Management Device Main Body

Management device main body 90 is configured from frame section 102 and beam section 104 that is mounted on frame section 102. Frame section 102 is hollow with pallet housing device 92 provided inside frame 102, and an upper end section of pallet housing device 92 exposed at the top surface of frame 102.

(b) Pallet Housing Device

Pallet housing device 92 includes multiple pallet loading shelves 106 and support arm 108. Pallet loading shelf 106 is for loading a nozzle pallet 110 on, and multiple pallet loading shelves 106 are arranged vertically inside frame section 102. Note that, multiple suction nozzles 60 are housed in nozzle pallet 110. Also, support arm 108, by operation of an arm moving device (not shown), in front of the multiple pallet loading shelves 106, moves in a vertical direction and in a direction towards and away from pallet loading shelves 106. By this, stowing of nozzle pallet 110 to pallet loading shelf 106 and removing of nozzle pallet 110 from pallet loading shelf 106 is performed by support arm 108. Note that, nozzle pallet 110 removed from pallet loading shelf 106 is moved to the upper side of frame section 102 by support arm 108 moving up.

(c) Nozzle Transfer Device

Nozzle transfer device 94 is for transferring suction nozzles 60 to and from nozzle tray 76 and nozzle pallet 110, and is provided on beam section 104. Nozzle transfer device 94 includes transfer head 120 and head moving device 122. Camera 126 facing downwards, holding chuck 128 for holding suction nozzle 60, and air supply device 130 are provided on a lower surface of transfer head 120.

Figure 5:
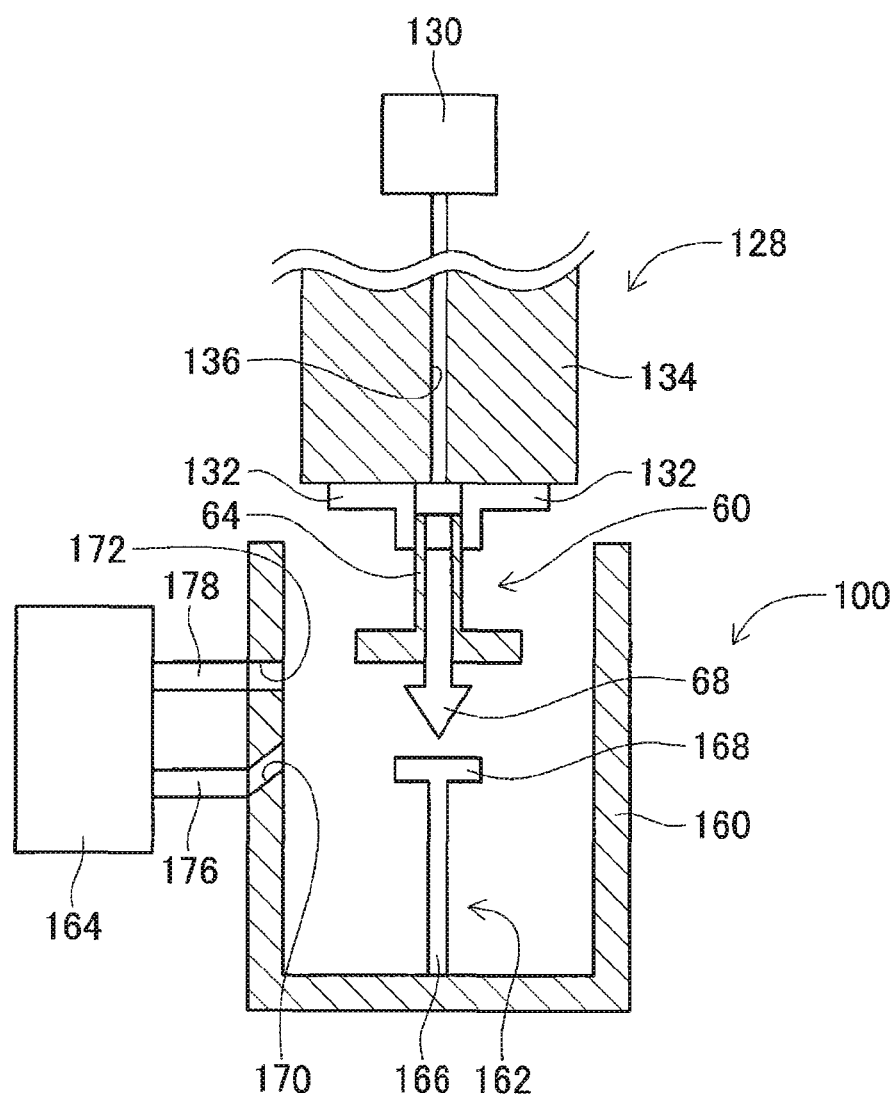
FIG. 5 is a cross-section view showing a nozzle drying device of a first embodiment.

As shown in FIG. 5, holding chuck 128 includes two holding claws 132, and by bringing together those two holding claws 132, suction nozzle 60 is held at body tube 64, and held suction nozzle 60 is released by the two holding claws 132 being released. Also, air passage 136 is formed in main body section 134 of holding chuck 128. One end of air passage 136 opens between the two holding claws 132, and the other end of air passage 136 is connected to air supply device 130. Thus, with holding chuck 128 holding suction nozzle 60, air is blown towards the inside of suction nozzle 60 by air being supplied to air passage 136 by air supply device 130. Thus, air is blown from body tube 64 of suction nozzle 60 and air is blown from the end section of suction pipe 68. Further, holding chuck 128 includes rotating device 138 (refer to FIG. 7) for rotating holding chuck 128 on its own axis. By this, suction nozzle 60 held by holding chuck 128 is rotated on its own axis.

Also, as shown in FIG. 4, head moving device 122 is an XYZ-type moving device that moves transfer head 120 forwards/backwards, left/right, and up/down on frame section 102. On the front upper surface of frame section 102, fixing stage 131 on which nozzle tray 76 is set is provided, and suction nozzles 60 are transferred to and from nozzle tray 76 set on fixing stage 131 and nozzle pallet 110 supported on support arm 108 of pallet housing device 92.

(d) Nozzle Inspection Device

Nozzle inspection device 96 includes camera 140, load cell 142, and joint 146. Camera 140 is arranged on an upper surface of frame section 102 facing upwards, and the end section of suction nozzle 60 is inspected using camera 140. In detail, suction nozzle 60 to be inspected is held by holding chuck 128, and an image is captured of the suction nozzle 60 held by the holding chuck 128 from below by camera 140. By this, image data of the end section of suction nozzle 60 is obtained, and based on that image data, the state of the end section of suction nozzle 60 is inspected.

Also, load cell 142 is arranged next to camera 140, and the expansion-contraction state of the end section of suction nozzle 60 is inspected using load cell 142. In detail, suction nozzle 60 to be inspected is held by holding chuck 128, and the end section of the suction nozzle 60 held by holding chuck 128 is contacted against load cell 142. The end section of suction nozzle 60 can be expanded and contracted, and the expansion-contraction state of the end section of suction nozzle 60 is inspected based on the load measured by load cell 142.

Also, joint 146 is arranged on a lower surface of air supply device 130, and air is supplied from air supply device 130. Further, air flow inspection of suction nozzle 60 is performed using air supplied from air supply device 130 to joint 146. In detail, by operation of head moving device 122, joint 146 is moved above a suction nozzle 60 loaded on one of nozzle tray 76 or nozzle pallet 110. Then, joint 146 is connected to the suction nozzle 60 to be inspected, and air is supplied from air supply device 130. Here, the air pressure is measured, and the air flow amount of suction nozzle 60 is inspected based on the air pressure.

Also, multiple discard boxes 148 are provided on an upper surface of frame section 102, and suction nozzles 60 determined by the inspection to be defective suction nozzles are discarded in discard boxes 148. Further, suction nozzles 60 determined by the inspection to be normal are returned to nozzle tray 76 or nozzle pallet 110.

(e) Nozzle Cleaning Device

Nozzle cleaning device 98 is for cleaning and drying suction nozzles 60, and is arranged next to pallet housing device 92. Nozzle cleaning device 98 is provided with cleaning and drying mechanism 150, and cleaning pallet moving device 152. Cleaning and drying mechanism 150 performs cleaning and drying of suction nozzle 60 internally. Also, cleaning pallet moving mechanism 152 moves cleaning pallet 158 to and from an exposed position in which cleaning pallet 158 is exposed (the position of cleaning pallet 158 in FIG. 4) and a position inside cleaning and drying mechanism 150.

(f) Nozzle Drying Device

Nozzle drying device 100 performs drying of suction nozzle 60, and is arranged next to cleaning pallet 158 positioned at the exposed position. As shown in FIG. 5, nozzle drying device 100 includes housing 160, contacting table 162, and air blow device 164. Housing 160 is substantially a cylindrical tube with a bottom. Contacting table 162 includes support section 166 and contacting section 168. Support section 166 is substantially rod-shaped, and is arranged roughly centrally at the bottom section of housing 160. Contacting section 168 is substantially disc-shaped and is fixed to the upper end of support section 166.

Air blow device 164 blows air towards the inside of housing 160. In detail, two through-holes, 170 and 172, are formed in a side wall of housing 160. First though-hole 170 pierces the side wall of housing 160 at roughly the same height as the upper end of contacting table 162, and is formed to extend in the diameter direction of housing 160. Also, first through-hole 170 is formed sloping upwards from the outside to the inside of the side wall of housing 160. Conversely, second through-hole 172 pierces the side wall of housing 160 above first through-hole 170 is formed extending in the diameter direction of 160 horizontally. First through-hole 170 and second through-hole 172 are connected to air blow device 164 via pipes 176 and 178. Thus, air blow device 164 blows air towards the inside of housing 160 via through-holes 170 and 172.

(g) Cleaning and Drying of Suction Nozzles

When cleaning is performed of a suction nozzle 60 by nozzle cleaning device 98, the suction nozzle 60 that is to be cleaned is moved by nozzle transfer device 94 from nozzle tray 76 or nozzle pallet 110 to cleaning pallet 158. Then, cleaning pallet 158, by operation of cleaning pallet moving mechanism 152, is moved inside cleaning and drying mechanism 150, and cleaning and drying of suction nozzle 60 is performed inside cleaning and drying mechanism 150. When cleaning and drying of suction nozzle 60 by cleaning and drying mechanism 150 is complete, cleaning pallet 158 is moved to the exposure position by operation of cleaning pallet moving mechanism 152.

Here, suction nozzle 60 is dried to a certain extent, but because drying of suction nozzle 60 is performed inside cleaning and drying mechanism 150 with suction nozzle 60 loaded in cleaning pallet 158, liquid may remain on suction nozzle 60. In particular, with suction nozzle 60, as described above, body tube 64 and suction pipe 68 are relatively movable, and because water can enter between body tube 64 and suction pipe 68, there are cases in which water remains between body tube 64 and suction pipe 68. For a suction nozzle 60 for which liquid remains between body tube 64 and suction pipe 68, there is a worry that the suction nozzle 60 will be determined as defective during the inspection using load cell 142. In detail, inspection using load cell 142, as described above, inspects the expansion-contraction state of the end section of suction nozzle 60, and for a suction nozzle 60 with liquid remaining between body tube 64 and suction pipe 68, the sliding resistance between body tube 64 and suction pipe 68 increases due to the liquid, meaning that the load measured by load cell 142 increases. Therefore, there is a danger that the expansion-contraction state of the end section of suction nozzle 60 will not be determined appropriately, and that the suction nozzle 60 will be determined to be a defective nozzle.

Considering his problem, with nozzle management device 80, when cleaning and drying of suction nozzle 60 by cleaning and drying mechanism 150 is complete, drying of suction nozzle 60 is performed again using nozzle drying device 100. In detail, suction nozzle 60 cleaned and dried by cleaning and drying mechanism 150 is picked up from cleaning pallet 158 and held by holding chuck 128. Then, holding chuck 128, by operation of head moving device 122, moves above nozzle drying device 100 and is lowered. Thus, as shown in FIG. 5, suction nozzle 60 held by holding chuck 128 is inserted into housing 160 of nozzle drying device 100. Note that, holding chuck 128 is lowered such that suction pipe 68 of suction nozzle 60 is positioned not contacting contacting section 168 of contacting table 162.

Then, air blow device 164 is operated such that air is blown towards the inside of housing 160 from through-holes 170 and 172. Here, holding chuck 128 is rotated by operation of rotating device 138. Thus, suction nozzle 60 held by holding chuck 128 is rotated, and air is blown around the entire circumference of suction nozzle 60. Also, when holding chuck 128 is rotating, air is supplied to air passage 136 by operation of air supply device 130, such that air is blown towards the inside of suction nozzle 60. Therefore, by air being blown inside suction nozzle 60, suction pipe 68 moves down relative to body tube 64 and protrudes downwards. By this, the sliding surfaces of suction pipe 68 with respect to body tube 64 are exposed, and air is blown across the entire sliding surfaces. In this manner, air is blown inside suction nozzle 60 that has been inserted into housing 160, and, by rotating suction nozzle 60, liquid remaining between body tube 64 and suction pipe 68 is appropriately removed.

Figure 6:
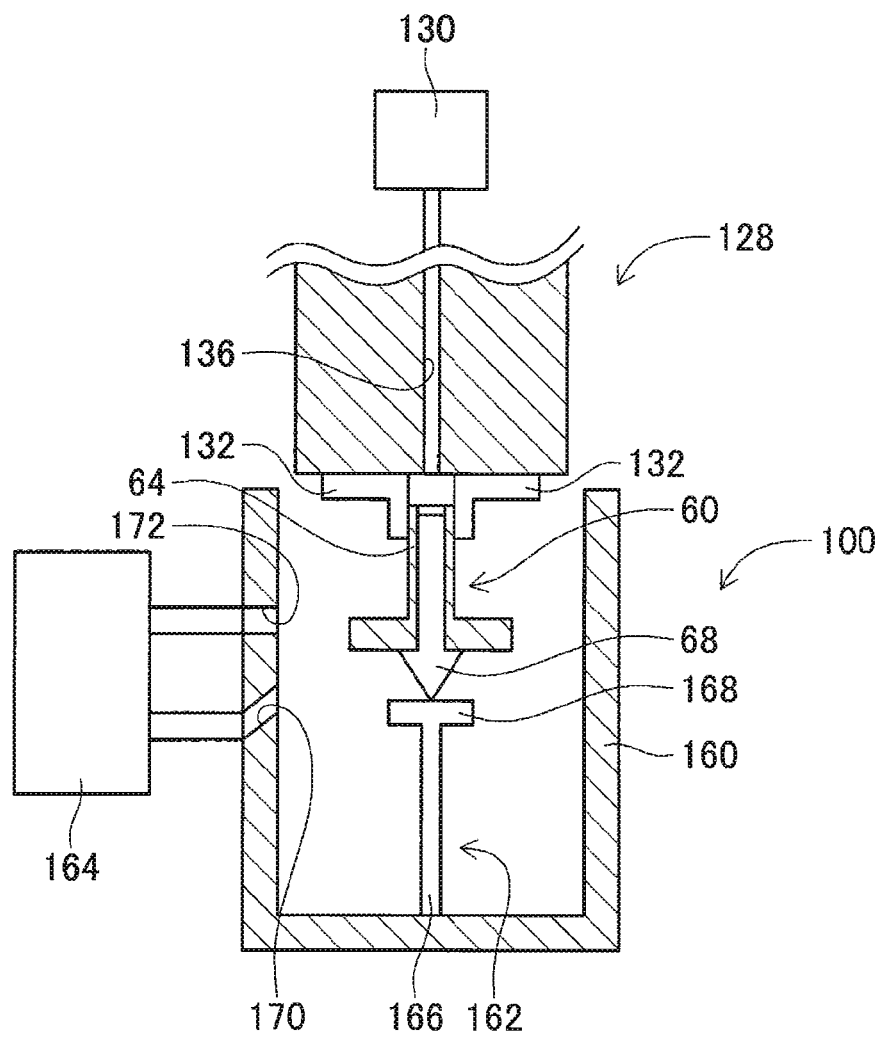
FIG. 6 is a cross-section view showing a nozzle drying device of a first embodiment.

Also, when rotation of suction nozzle 60 and blowing of air by operation of air supply device 130 have been performed for a specified time, rotation of suction nozzle 60 and blowing of air by operation of air supply device 130 are stopped, and holding chuck 128 is lowered by operation of head moving device 122. Thus, as shown in FIG. 6, the end section of suction pipe 68 of suction nozzle 60 held by holding chuck 128 contacts contacting section 168 of contacting table 162 such that suction pipe 68 is inserted inside body tube 64.

Then, after suction pipe 68 has been inserted inside body tube 64, holding chuck 128 is raised by operation of head moving device 122, such that suction pipe 68 and contacting section 168 are separated. Then, once again, rotation of suction nozzle 60 and blowing of air towards the inside of suction nozzle 60 by operation of air supply device 130 are performed. That is, by inserting suction pipe 68 into body tube 64, if liquid remained on the inside of body tube 64, that liquid would adhere to the sliding surface of suction pipe 68. Then, by blowing air towards the inside of suction nozzle 60, suction pipe 68 protrudes from body tube 64, and the sliding surface to which the liquid is adhered is exposed. Here, by rotation of suction nozzle 60 and blowing of air towards suction nozzle 60 by operation of air blow device, liquid on the sliding surface of suction pipe 68 is removed. In this manner, by rotating suction nozzle 60 and blowing air inside suction nozzle 60 by operation of air supply device 130 again after inserting suction pipe 68 into body tube 64, it is possible to reliably remove liquid from inside body tube 64. Note that, insertion of suction pipe 68 into body tube 64, and rotation of suction nozzle 60 and blowing of air inside suction nozzle 60 by operation of air supply device 130 are performed repeatedly a predetermined number of times.

In this manner, with nozzle drying device 100, by performing insertion of suction pipe 68 into body tube 64, and rotation of suction nozzle 60 and blowing of air inside suction nozzle 60 by operation of air supply device 130 repeatedly multiple times, liquid that has entered between body tube 64 and suction pipe 68 is effectively removed. Then, suction nozzle 60 for which drying by nozzle drying device 100 is complete is returned to nozzle tray 76 or nozzle pallet 110 by operation of head moving device 122.

Figure 7:
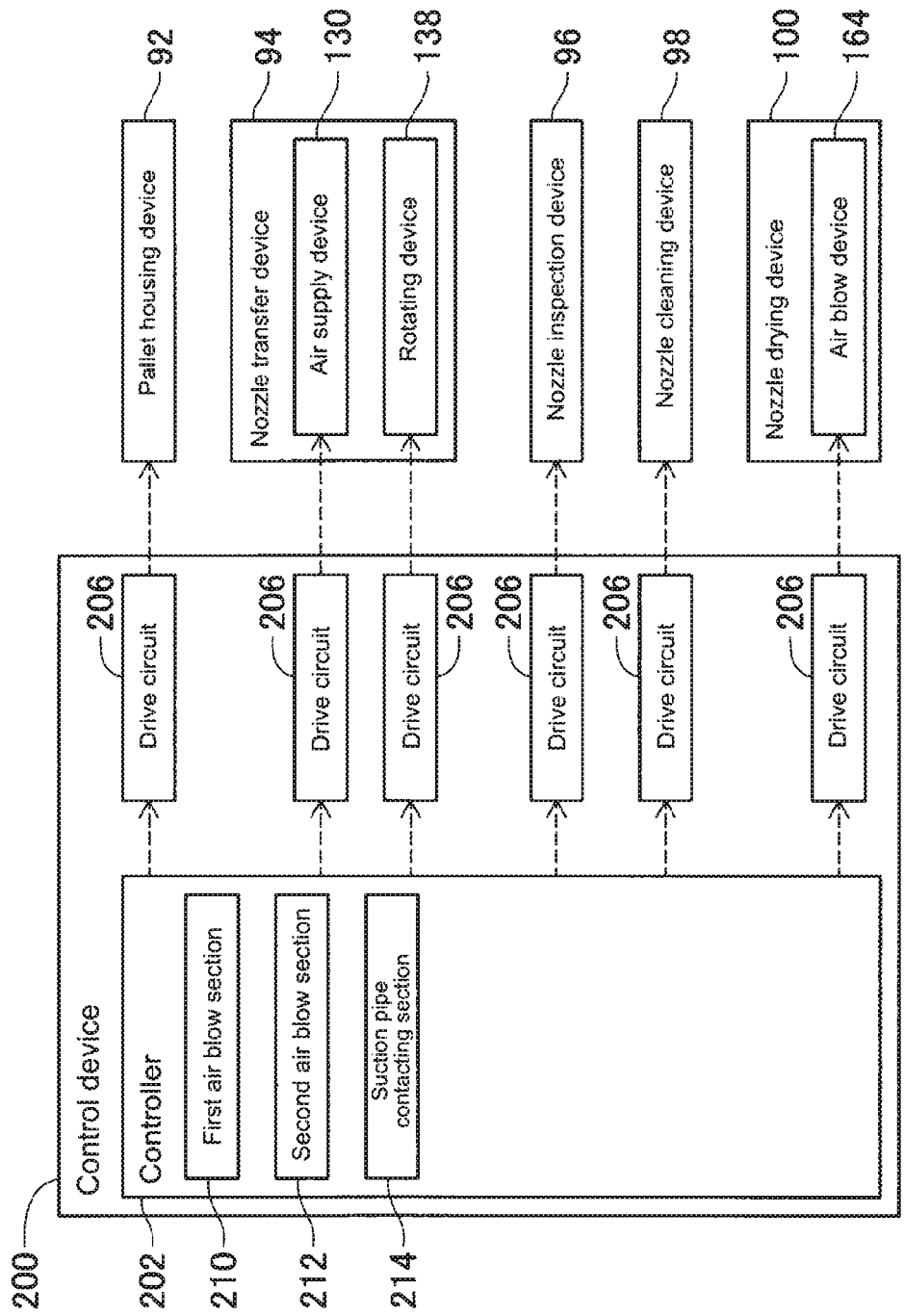
FIG. 7 is a block diagram showing a control device provided in the nozzle management device.

Further, as shown in FIG. 7, nozzle management device 80 is provided with control device 200. Control device 200 is provided with controller 202 and multiple drive circuits 206. The multiple drive circuits 206 are connected to pallet housing device 92, nozzle inspection device 96, nozzle cleaning device 98, air supply device 130, and air blow device 164. Controller 202 is provided with a CPU, ROM, RAM, and the like, is formed mainly from a computer, and is connected to the multiple drive circuits 206. Thus, operation of pallet housing device 92, nozzle transfer device 94, and the like, is controlled by controller 202. Also, controller 202 includes first air blow section 210, second air blow section 212, and suction pipe contacting section 214. First air blow section 210 is a functional section for blowing air towards suction nozzle 60 by operation of air blow device 164. Second air blow section 212 is a functional section for blowing air towards the inside of suction nozzle 60 by operation of air supply device 130. Suction pipe contacting section 214 is a functional section for lowering holding chuck 128 and contacting suction pipe 68 against contacting table 162.

Second Embodiment

Figure 8:
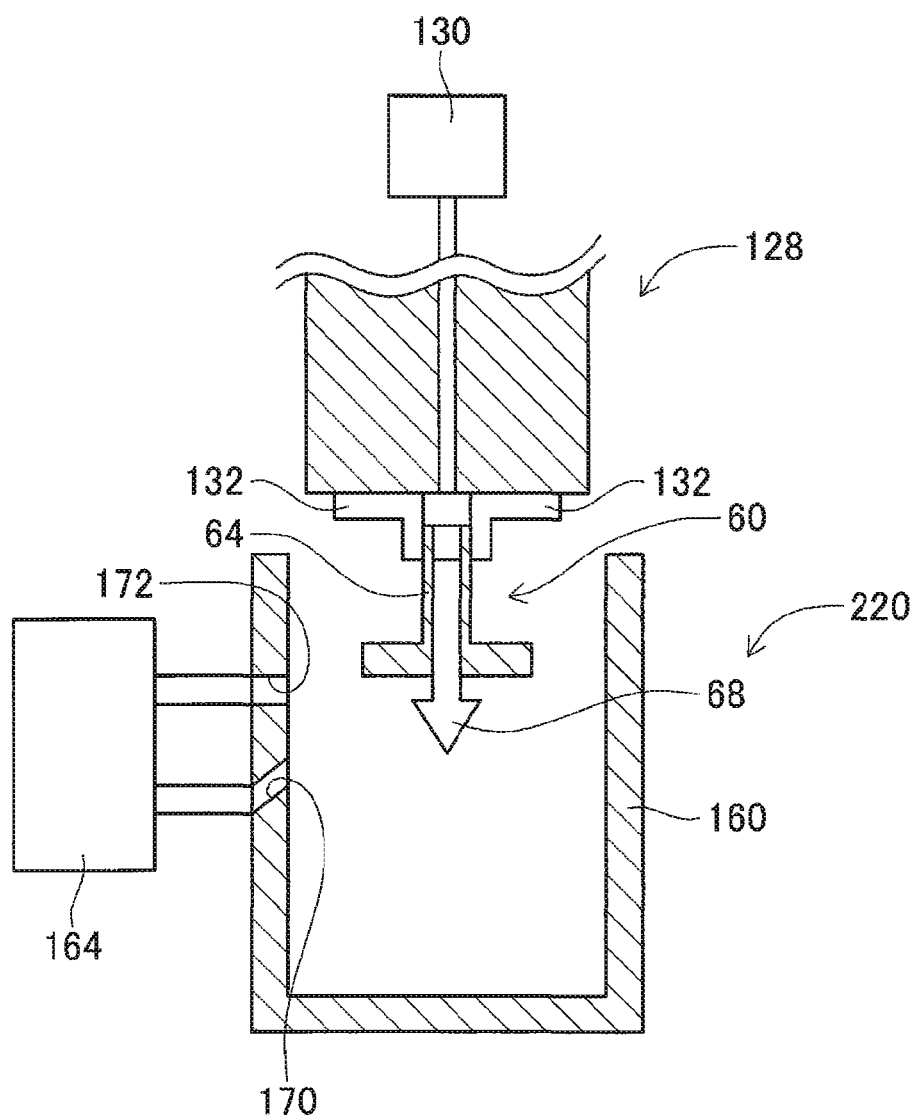
FIG. 8 is a cross-section view showing a nozzle drying device of a second embodiment.

In nozzle drying device 100 of a first embodiment, as shown in FIG. 5, contacting table 162 is provided, but in nozzle drying device 220 of a second embodiment, as shown in FIG. 8, contacting table 162 is not provided. The cleaning method of suction nozzle 60 in nozzle drying device 220 as configured above is described below. Note that, except for not having contacting table 162, nozzle drying device 220 of the second embodiment has the same configuration as nozzle drying device 100 of the first embodiment. Therefore, the same reference numbers are given to configuration elements with the same function as configuration elements of nozzle drying device 100 and descriptions of those items are omitted.

When performing drying of suction nozzle 60 by nozzle drying device 220 of the second embodiment, first, similar to nozzle drying device 100 of the first embodiment, suction nozzle 60 held by holding chuck 127 is inserted into housing 160, and air is blown towards the inside of housing 160 by operation of air blow device 164. Here, rotation of suction nozzle 60 and blowing of air towards the inside of suction nozzle 60 by operation of air supply device 130 are performed.

Figure 9:
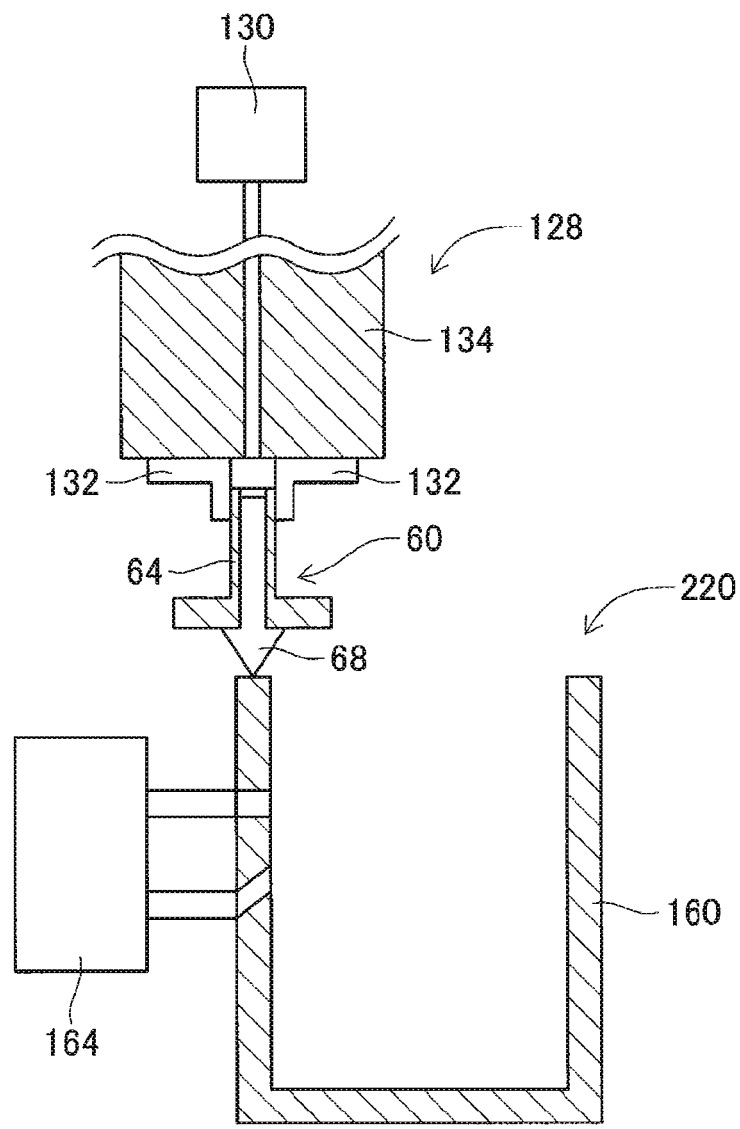
FIG. 9 is a cross-section view showing a nozzle drying device of a second embodiment.

When rotation of suction nozzle 60 and blowing of air towards the inside of suction nozzle 60 by operation of air supply device 130 have been performed for a specified time, holding chuck 128 is raised. Thus, suction nozzle 60 held by holding chuck 128 is moved above housing 160. Then, holding chuck 128 is moved above a side wall of housing 160 and lowered. By this, as shown in FIG. 9, suction pipe 68 of suction nozzle 60 held by holding chuck 128 contacts the upper end of the side wall of housing 160 such that suction pipe 68 is inserted inside body tube 64.

Then, when suction pipe 68 has been inserted inside body tube 64, holding chuck 128 is moved and suction nozzle 60 held by holding chuck 128 is inserted inside housing 160. Here, rotation of suction nozzle 60 and blowing of air towards the inside of suction nozzle 60 by operation of air supply device 130 are performed. That is, with nozzle drying device 220 of the second embodiment, the upper end of the side wall of housing 160 functions as contacting table 162 of the first embodiment, and insertion of suction pipe 68 into body tube 64, rotation of suction nozzle 60 and blowing of air inside suction nozzle 60 by operation of air supply device 130 are performed. By this, with nozzle drying device 200 of the second embodiment, it is possible to achieve the same effects as with nozzle drying device 100 of the first embodiment.

Note that, in the above embodiment, suction nozzle 60 is an example of a component holding body and a suction nozzle. Body tube 64 is an example of a main body section and a holding tube. Suction pipe 68 is an example of a holding section and a suction pipe. Nozzle drying device 100 is an example of a foreign matter removal device. Holding chuck 128 is an example of a holding tool. Air supply device 130 is an example of a second air blow device. Housing 160 is an example of a housing. Contacting table 162 is an example of a housing. Air blow device 164 is an example of a first air blow device. Nozzle drying device 220 is an example of a foreign matter removal device. First air blow section 210 is an example of an item for performing a first gas blow process. Second air blow section 212 is an example of an item for performing a second gas blow process. Suction pipe contacting section 214 is an example of an item for performing a moving process.

Further, the present disclosure is not limited to the above example embodiments, and various changed or improved methods of embodiment are possible based on the knowledge of someone skilled in the art. Specifically, for example, in an embodiment above, the present disclosure is applied to a method and device for removing a liquid adhering to a suction nozzle, but the present disclosure may be applied to a method and device for removing liquid adhering to a mechanical chuck. In detail, a mechanical chuck is normally configured from multiple claw sections and a main body section that holds the multiple claw sections so as to be movable towards and away from each other; a component is held by moving the multiple claw sections towards each other, and a component is released by moving the multiple claw sections away from each other. When air is blown onto a mechanical chuck, by contacting the claw section against the contacting section, the claw section and the main body section are moved relatively, thus it is possible to remove liquid that has entered between the claw section and the main body section. Also, it is possible to move the claw section and the main body section relatively by air, electromagnetic motor, or the like, without contacting the claw section against the contacting section.

Also, in an embodiment above, a liquid is the foreign matter to be removed, but various other foreign matter may be applicable, such as oil, dust, an electronic component or portion thereof, solder, adhesive, and the like. Further, in an embodiment above, foreign matter is removed by blowing air, but another gas may be blown to remove foreign matter, such as nitrogen.

Also, for example, in an embodiment above, suction pipe 68 of suction nozzle 60 is contacted against contacting table 162 or the upper end of the side wall of housing 160, but suction pipe 68 may be contacted against various items, so long as the item is suitable for pushing suction pipe 68 into body tube 64.

Also, an embodiment above is applied to a method or device for appropriately removing liquid remaining between body tube 64 and suction pipe 68, but may be applied for removing various foreign matter from that area. For example, if body tube 64 and suction pipe 68 are moved relatively, the adhering power of foreign matter remaining between those items can be weakened, and removal by blowing air made easier.

REFERENCE SIGNS LIST

60: suction nozzle (component holding body); 64: body tube (main body section) (holding tube); 68: suction pipe (holding section); 100: nozzle drying device (foreign matter removal device); 128: holding chuck (holding tool); 130: air supply device (second gas blow device); 160: housing; 162: contacting table (contacting section); 164: air blow device (first gas blow device); 220: nozzle drying device (foreign matter removal device)

The invention claimed is:

1. A foreign matter removal method for removing foreign matter adhering to a component holding tool including a holding section for holding a component and a main body section for holding the holding section, the holding section and the main body section being relatively movable, the foreign matter removal method comprising:
    a first gas blowing process for blowing a gas towards a component holding body held by a holding tool; and
    a moving process for relatively moving the holding section and the main body section.

2. The foreign matter removal method according to claim 1, wherein
    the component holding body is a suction nozzle including a suction pipe for picking up and holding a component via air suction, and a holding tube for holding the suction pipe inside the holding tube in a state with a leading end of the suction pipe protruding from the holding tube,
    the suction pipe functioning as the holding section, and the component holding body functioning as the main body section.

3. The foreign matter removal method according to claim 2, wherein
    the moving process is a process for moving the suction pipe towards the inside of the holding tube by contacting the suction pipe of the suction nozzle held by the holding tool against a contacting section.

4. The foreign matter removal method according to claim 2, wherein
    the holding tool is provided with a first gas blow device configured to blow gas towards the inside of the suction pipe of the held suction nozzle, and
    the foreign matter removal method further includes
    a second gas blow process for blowing gas inside the suction pipe of the suction nozzle held by the holding tool, using the first gas blow device.

5. The foreign matter removal method according to claim 4, wherein
    the second gas blow process is a process for moving the suction pipe towards the outside of the holding tube by blowing gas inside the suction pipe of the suction nozzle held by the holding tool against a contacting section, using the first gas blow device.

6. A foreign matter removal device for removing foreign matter adhering to a suction nozzle including a suction pipe for picking up and holding a component via air suction, and a holding tube for holding the suction pipe inside the holding tube in a state with a leading end of the suction pipe protruding from the holding tube, the suction pipe and the holding tube being relatively movable, the foreign matter removal device comprising:

a tubular housing;

a first gas blow device configured to blow gas towards the inside of the suction pipe of the suction nozzle held by a holding tool;

a second gas blow device configured to blow gas towards the inside of the housing; and a contacting section attached to the housing and configured to contact the suction pipe of the suction nozzle, wherein the suction pipe is moved towards the outside of the holding tube by the first gas blow device blowing gas inside the suction pipe, the suction pipe is moved towards the inside of the holding tube by contacting the suction pipe of the suction nozzle held by the holding tool against the contacting section, and foreign matter adhering to the suction nozzle is removed by the second gas blow device blowing gas towards the inside of the housing in a state with the suction nozzle held by the holding tool moved inside of the housing.

* * * * *